United States Patent [19]

Jungert et al.

[11] Patent Number: 5,036,232

[45] Date of Patent: Jul. 30, 1991

[54] PUSH-PULL OUTPUT STAGE OF INTEGRATED CIRCUIT PROVIDING ENHANCED HIGH-LOW VOLTAGE LEVEL SIGNAL TRANSITION WITH GROUND BOUNCE CONTROL

[75] Inventors: Horst A. Jungert, Buch am Erlbach; Manfred H. Müller, Nandlstadt, both of Fed. Rep. of Germany

[73] Assignee: Texas Instruments Deutschland GmbH, Fed. Rep. of Germany

[21] Appl. No.: 480,441

[22] Filed: Feb. 15, 1990

[30] Foreign Application Priority Data

Feb. 17, 1989 [DE] Fed. Rep. of Germany ....... 3904901

[51] Int. Cl.$^5$ .............. H03K 3/013; H03K 5/13; H03K 17/28; H03K 17/687
[52] U.S. Cl. ................... 307/542; 307/443; 307/448; 307/473; 307/594; 307/596
[58] Field of Search ............ 307/443, 542, 572, 448, 307/451, 452, 585, 552, 558, 568, 555, 592, 594, 597, 246, 263, 242

[56] References Cited

U.S. PATENT DOCUMENTS

| | | | |
|---|---|---|---|
| 4,068,090 | 1/1978 | Komatsu et al. | 179/1 A |
| 4,771,195 | 9/1988 | Stein | 307/572 |
| 4,785,201 | 11/1988 | Martinez | 307/443 |
| 4,789,793 | 12/1988 | Ehni et al. | 307/303 |
| 4,820,942 | 4/1989 | Chan | 307/542 |
| 4,885,485 | 12/1989 | Leake et al. | 307/542 |
| 4,906,871 | 3/1990 | Iida | 307/443 X |
| 4,908,528 | 3/1990 | Huang | 307/542 X |
| 4,918,339 | 4/1990 | Shigeo et al. | 307/542 |
| 4,959,565 | 9/1990 | Knecht et al. | 307/542 |
| 4,961,010 | 10/1990 | Davis | 307/263 X |

OTHER PUBLICATIONS

Texas Instruments, *Advanced CMOS Logic, Designers Handbook*, Chapter 3.1.5, pp. 3-9 to 3-11, 1987.

*Primary Examiner*—Stanley D. Miller
*Assistant Examiner*—David R. Bertelson
*Attorney, Agent, or Firm*—William E. Hiller; N. Rhys Merrett; Melvin Sharp

[57] ABSTRACT

A push-pull output stage of an integrated circuit for generating a pulse-like output signal in dependence upon a pulse-like input signal. The push-pull output stage includes complementary output field-effect transistors which are formed by respective first and second groups of parallel-connected subtransistors (P1 to P4; N1 to N4), the subtransistors in each group being of the same conductivity type and opposite from that of the subtransistors in the other group. A resistance element (TP0 to TP3; TN0 to TN3) is connected into the lead to each gate electrode of each of the subtransistors (P1 to P4; N1 to N4) of the two groups of subtransistors. A disconnecting field-effect transistor (PD1 to PD4; ND1 to ND4) is associated with each subtransistor (P1 to P4; N1 to N4) of the two groups of subtransistors. Connected in parallel with each group of subtransistors (P1 to P4; N1 to N4) is a control field-effect transistor (MN, MP) of respective opposite conductivity type which is connected as a source follower with respect to the input signal and the output signal. The subtransistors of each group and the resistance elements corresponding thereto form a distributed RC network to facilitate high-low voltage level signal transition of the signal during the operation of the integrated circuit, while the control transistor enhances the edge steepness of the signal in the center region of the signal when undergoing a transition. The push-pull output stage thereby inhibits ground bounce from the overshoot of the pulse-like signal which could cause an inaccurate interpretation of the voltage level of the pulse-like signal.

4 Claims, 1 Drawing Sheet

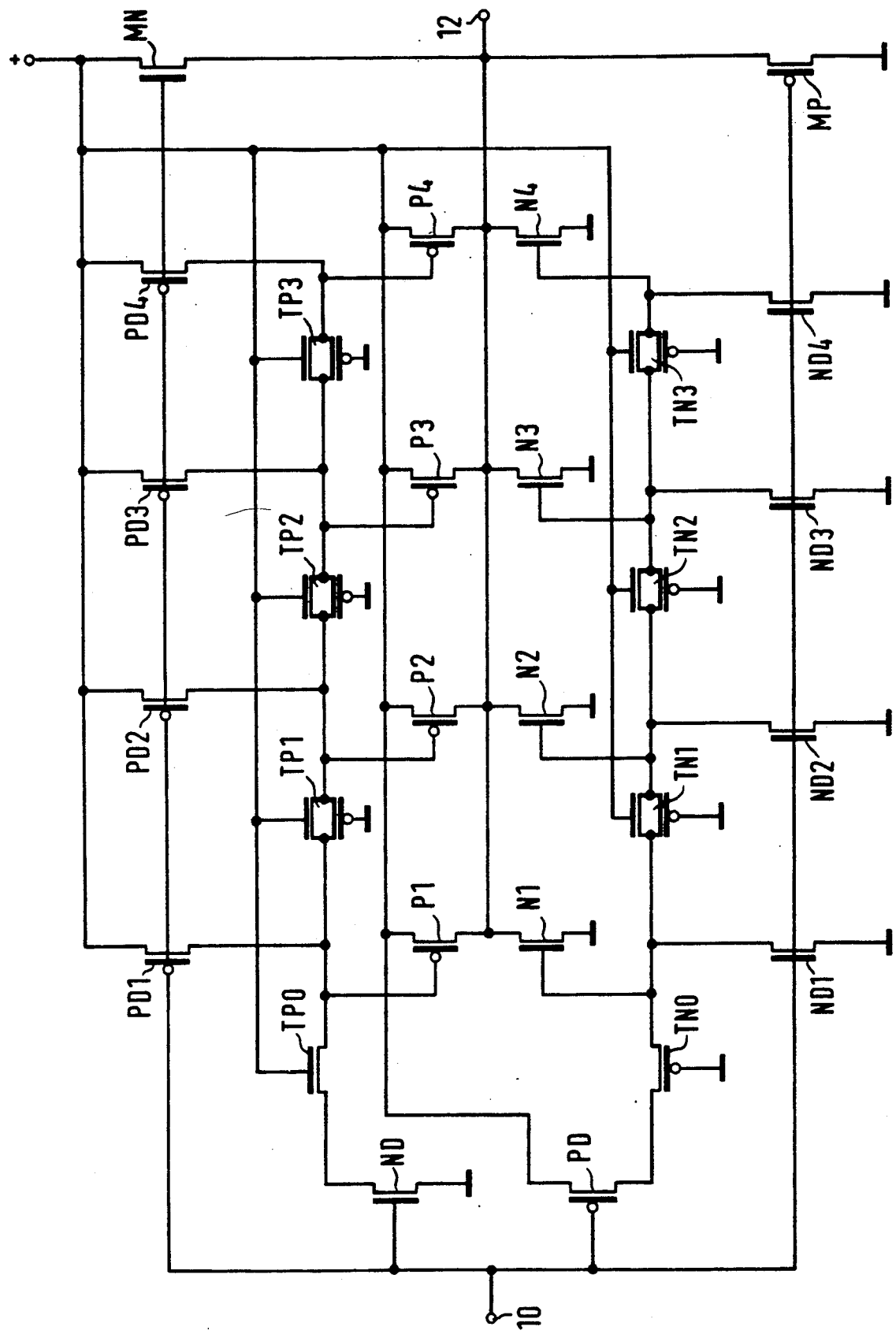

PUSH-PULL OUTPUT STAGE OF INTEGRATED CIRCUIT PROVIDING ENHANCED HIGH-LOW VOLTAGE LEVEL SIGNAL TRANSITION WITH GROUND BOUNCE CONTROL

BACKGROUND OF THE INVENTION

1. Field of the Invention

The invention relates to an integrated push-pull output stage for generating a pulse-like output signal in dependence upon a pulse-like input signal comprising complementary output field-effect transistors which are formed by respect first and second groups of parallel-connected subtransistors the subtransistors in each group being of the same conductivity type and opposite from that of the subtransistors in the other groups.

2. Description of the Prior Art

In integrated semiconductor circuits which have been developed specifically for obtaining high switching speeds parasitic inductances of the supply lines to the active circuit elements have proved particularly disadvantageous because they prevent implementation of the theoretically possible high switching speeds in practice. In particular, in the output stages of integrated circuits in which relatively high currents flow, in the parasitic line inductances in highspeed switching operations, thus for example in high speed switching between a high voltage level and a low voltage level, high voltage peaks are generated which lead to a strong overshooting at the pulses furnished by the respective output stage. The overshooting can lead to erroneous output signals because particularly with a low signal value, which lies in the range of ground potential, an undesired increase of the potential occurs which by the subsequent circuit stages, in the most unfavourable case, leads to the signal furnished by the output stage being interpreted as a signal with high value due to the overshoot phenomena although it should actually be a signal with low value. This phenomenon is referred to in (English usage as "ground bounce".

The overshoot can of course be reduced in that the switching edges of the pulse-like signals may be made slower but this however is contrary to the objective of achieving high switching speeds. In the book published by the company Texas Instruments "Advanced CMOS Logic, Designers Handbook", which came out in 1987, in chapter 3.1.5, page 3-9, an output stage is described in which steps are taken to reduce the unfavourable overshoot. In this output stage the output transistors are each formed from a plurality of individual transistors which are connected in parallel with each other. The gate zones of said individual transistors are connected in series and act like a resistive line. Since this line also has a certain capacitance the series circuit of the gate zones acts like a delay line so that the signal from the first transistor to the last transistor of the parallel-connected individual transistors requires a certain travelling time. However, without special measures this delay is not large enough to slow the edges of the switching pulses down to such an extent that undesirable overshoots no longer occur. The particular measure for reducing the overshoots includes in this known output stage the use of a current grounding or dissipating transistor which is connected to the series circuit of the gate zones of the output transistors of one of the two groups of individual transistors in the push-pull output stage and in the switched-on state causes a current to flow through the series circuit of the gate zones to ground.

The flowing of the current through the series circuit of the gate zones results in voltage drops occurring at the individual gate zones which act like individual resistances so that the gate voltages diminish consecutively from the first transistor of the group to the last. Due to the voltage drops occurring at the individual gate zones this additional current through the series circuit of the gate zones caused by the current grounding transistor opposes the formation of the overshoots. The current dissipating or grounding transistor must however be rendered nonconductive again after a defined time to prevent current permanently flowing through the gate zones. This blocking is carried out in dependence upon the input signal of the output stage from which by means of a delay circuit a control signal is generated which after the delay generated by the delay circuit renders the current grounding transistor nonconductive again. In the most favourable case, i.e. when the production-inherent parameters of the output stage have good values, the delay circuit must keep the current grounding transistor conductive long enough for the current to flow through the series circuit of the gate zones long enough for the desired effect of the gate voltage reduction to be maintained for an adequately long time. This current flow and the resulting voltage drop at the gate zones is the condition necessary for the undesired overshoots to be greatly reduced. If however the production-inherent parameters of the integrated output stage have unfavourable values the travelling time of the signal through the gate zones is from the start already relatively long and consequently the current additionally caused by the current grounding transistor together with the resulting further increase of the travelling time leads to excessive slowing down of the edges of the output signal of the output stage and this is extremely undesirable because the current grounding transistor, although it is intended to reduce the overshoot, should not excessively slow down the edge steepness of the output pulses.

SUMMARY OF THE INVENTION

The invention is based on the problem of providing an integrated push-pull output stage in which the overshoot at the pulses of the output signal is substantially reduced without the switching speed of the output stage being appreciably impaired.

According to the invention this problem is solved in that a resistance element is inserted into the lead to each gate electrode of each of the subtransistors in each of first and second groups of subtransistors defining output transistors, that a disconnecting field-effect transistor is associated with each subtransistor in each group and that with each group of subtransistors a control field-effect transistor of respective opposite conductivity type is connected in parallel the control transistor being connected as a source follower with respect to the input signal and the output signal.

The invention will now be explained by way of example with reference to the drawings.

BRIEF DESCRIPTION OF THE DRAWINGS

The single FIGURE is a circuit diagram of a push-pull output stage of an integrated circuit according to the invention.

DESCRIPTION OF THE PREFERRED EMBODIMENT

The output stage illustrated in the drawings is a CMOS push-pull output stage including output transistors each four subtransistors, i.e. the P-channel subtransistors P1, P2, P3, P4 and the N-channel subtransistors N1, N2, N3, N4. As can be seen, the subtransistors of each group are connected in parallel to each other, a subtransistor of the one group being connected in each case in series with a subtransistor of the other group, i.e. for example the subtransistor P4 with the subtransistor N4. between the gate electrodes of the parallel-connected subtransistors P1 to P4 and N1 to N4 resistance elements TP1, TP2, TP3 and TN1, TN2, TN3 are inserted. These resistance elements, as usual in integrated circuit technology, are each formed by two parallel-connected individual transistors, one of the transistors being an N-channel transistor and the other a P-channel transistor. The resistance element connected in front of the gate electrode of the respective first subtransistor P1, N1 consists in each case of a field-effect transistor TP0 and TN0 respectively although this resistance element could also be made up like the resistance elements TP1 to TP3 or TN1 to TN3. Lying in parallel with each group of subtransistors P1 to P4, N1 to N4 is a transistor MN and MP respectively which is connected as a source follower, which means that at its source electrode apart from the gate-source voltage occurring there as a voltage drop the voltage applied to its gate electrode is emitted.

Connected to each gate electrode of each subtransistor P1 to P4 and N1 to N4 is a disconnecting or switch-off transistor PD1 to PD4 or ND1 to ND4 respectively which in certain operating phases ensures reliable disconnection of the respective subtransistors.

The output stage described behaves as follows:

It will be assumed that at the input terminal 10 of the output stage a signal of low voltage value is applied. In this state the transistor ND is nonconductive whilst the transistor PD is in the conductive state. The transistors PD1 to PD4 are conductive whilst the transistors ND1 to ND4 are nonconductive. At the output terminal 12 of the output stage there is also a signal with low voltage value. The transistors MN and MP are likewise blocked because between their gate and source electrodes there is no potential difference as would however be necessary to set these transistors to the conductive state. The subtransistors P1 to P4 are blocked due to the conductive state of the transistors PD1 to PD4 whilst the subtransistors N1 to N4 are held in the conductive state.

It is now assumed that the input voltage at the input terminal 10 rises so that the transistor ND becomes conductive. At the same time the transistors PD1 to PD4 are rendered nonconductive. It is presumed here that the voltage rise at the input terminal 10 is with steep edge. The resistance elements TP0 to TP3 formed by transistors form together with the gate capacitances of the subtransistors P1 to P4 a divided C network which acts like a delay line. This means that with the rise of the voltage value of the signal at the input terminal 10 and the passage of the transistor ND to the conductive state the subtransistors P1 to P4 do not become conductive simultaneously but consecutively with a certain delay and as a result the voltage jump of the input signal is reproduced in the output signal only in retarded form. Since the subtransistors P1 to P4 become conductive consecutively it is not necessary for a large current to start flowing in a very short time; instead, smaller subcurrents start to flow consecutively and as a result in the lines connected to the output terminal the current changes per unit time are smaller so that the voltages induced in the line inductances are reduced.

Since the resistance elements TP0 to TP3 are made up of transistors they are subjected largely to the same parameter fluctuations of the manufacturing process as the subtransistors P1 to P4 acting as capacitances. If the resistance elements TP0 to TP3 become of higher resistance because of a process deviation then the gate capacitances of the subtransistors P1 to P4 arising under the influence of the same process deviations necessarily become smaller so that the product of resistance and capacitance, that is the RC time constant of the aforementioned RC network, remains approximately constant.

The transistor MN connected in parallel with the subtransistors P1 to P4 substantially contributes to avoiding excessive overshoot when switching the input signal from a low voltage value to a high voltage value. The transistor MN receives the input signal directly at its gate electrode so that it passes to the conductive state after the input signal has exceeded its threshold voltage value. Since the voltage at the output terminal 12 reaches the high voltage value only with delay a voltage difference between the gate electrode of the transistor MN and its source electrode connected to the output terminal 12 is present only during the leading edge of the input signal so that said transistor MN can also only conduct current for as long as the input signal varies. If however a constant voltage value is present at the input terminal 10 the transistor MN cannot conduct any current because of the identity of the voltages at its gate electrode and at its source electrode.

The use of the transistor MN connected as a source follower has a further advantage. When the circuit has lower resistance parameters due to the process or when at the output 12 a smaller (more resistive) load is present due to the resultant steeper edge of the output signal the transistor MN is effective for a shorter period than with more resistive circuit parameters and greater (less resistive load. This feedback effect occurs because the transistor MN, as mentioned above, is effective in dependence upon the voltage difference between its gate electrode and its source electrode.

Since in accordance with the above explanation the transistor MN can only be effective during the transition of the input signal from the low voltage value to the high voltage value, this transistor influences the profile of the leading edge of the signal at the output terminal 12. The transistor MN connected as a source follower makes the edge steeper in the centre region of the rise without however any danger of overshoot occurring because it goes into the nonconductive state again as soon as the voltage at the output terminal 12 differs from the voltage at the input terminal 10 by less than the gate-source voltage drop occurring at the transistor MN.

In the case of the transition of the signal at the input terminal 10 from the low voltage value to the high voltage value the transistors ND1 to ND4 act as disconnecting transistors for the subtransistors N1 to N4 because with the rise of the input voltage they apply to the gate electrodes of the subtransistors N1 to N4 the ground signal which reliably blocks the subtransistors so that only the subtransistors P1 to P4 can be effective.

The connecting together of the subtransistors P1 to P4 with the resistance elements TP0 to TP3 to form a distributed RC network with the effect of a delay line makes it possible to work with a steep-edged transition from the low voltage. value to the high voltage value at the input terminal 10 because the said RC network reduces the edge steepness at the edge start and edge end. The transistor MN ensures that this does not lead to an appreciable retardation of the edge as a whole because as explained above this transistor makes the edge steeper in its centre region.

The description so far relates to the transition of the voltage at the input terminal 10 from a low value to a high value. It applies accordingly to the transition from a high value to a low value, the respective complementary transistors with their corresponding behaviour then being active. In this case the subtransistors N1 to N4 with their associated resistance elements TN0 to TN3 act as distributed RC network with the effect of a delay line and the transistor MP connected in parallel with the subtransistors N1 to N4 takes over the action described above of the transistor MN.

The circuit described thus permits the generation of a steep-edge output signal and the edge steepness is achieved both with ascending and descending edges. In spite of the. edge steepness an undesirable overshoot is avoided.

We claim:

1. A push-pull output stage of an integrated circuit for generating a pulse-like output signal in dependence upon a pulse-like input signal susceptible to high switching speeds wherein the high-low voltage level transition of the signal during the operation of the integrated circuit is achieved while inhibiting the overshoot of the pulse-like signal leading to inaccurate interpretation of the pulse-like signal as to the voltage level thereof, said push-pull output stage comprising:
   a first plurality of output field-effect transistors having respective source and drain regions and gate electrodes extending therebetween, said first plurality of output field-effect transistors being connected in parallel and defining a first group of subtransistors;
   a second plurality of output field-effect transistors of opposite channel polarity with respect to said first plurality of output field-effect transistors and having respective source and drain regions and gate electrodes extending therebetween, said second plurality of output field-effect transistors being connected in parallel and defining a second group of subtransistors;
   each of said subtransistors of said first group of subtransistors being connected in series to the corresponding subtransistors of said second group of subtransistors;
   an input terminal for receiving the input signal and connected to said first and second groups of subtransistors;
   switching means interposed in the connection between said input terminal and each of said first and second groups of subtransistors to alternatively render said first and second groups of subtransistors conductive and nonconductive in response to the logic state of the input signal at a high voltage level or a low voltage level;
   an output line connected between each subtransistor of said first group of subtransistors and the corresponding subtransistor of said second group of subtransistors and terminating in an output terminal from which the output signal is produced;
   a resistance element connected to the gate electrode of each of the subtransistors of each of said first and second groups of subtransistors;
   the resistance elements connected between the gage electrodes of consecutive subtransistors of each of said first and second groups of subtransistors respectively comprising a pair of complementary parallel-connected field-effect transistors;
   a disconnecting field-effect transistor connected to each subtransistor of each of said first and second groups of subtransistors; and
   a control field-effect transistor connected in parallel to each of said first and second groups of subtransistors, each said control field-effect transistor being of opposite channel polarity with respect to the subtransistors of the group of subtransistors to which the respective control field-effect transistor is connected in parallel, each said control field-effect transistor being connected with respect to the input signal and the output signal as a source follower.

2. A push-pull output stage as set forth in claim 1, wherein said switching interposed in the connection between said input terminal and each of said first and second groups of subtransistors comprises respective first and second field-effect switching transistors of opposite channel polarity and connected between said input terminal and said group of subtransistors of opposite channel polarity with respect thereto;
   said first switching transistor being respectively connected to the gate electrodes of said first group of subtransistors, and said second switching transistor being respectively connected to the gate electrodes of said second group of subtransistors.

3. A push-pull output stage as set forth in claim 2, wherein the resistance element connected to the gate electrode of the leading subtransistors of each of said first and second groups of subtransistors respectively comprises a field-effect transistor of the same channel polarity as the switching transistor correspondence to the group of subtransistors with which the leading resistance element is associated.

4. A push-pull output stage as set forth in claim 2, wherein said disconnecting transistors are of the same channel polarity type as that of the subtransistors of the group of subtransistors with which the disconnecting transistors are associated; and
   said disconnecting transistors being respectively connected to the gate electrodes of the subtransistors corresponding thereto of each of the first and second groups of subtransistors.

* * * * *